US011520963B2

(12) United States Patent
Strasser et al.

(10) Patent No.: US 11,520,963 B2
(45) Date of Patent: Dec. 6, 2022

(54) SYSTEM AND METHOD FOR FORMAL FAULT PROPAGATION ANALYSIS

(71) Applicant: Onespin Solutions GmbH, Munich (DE)

(72) Inventors: Dominik Strasser, Munich (DE); Jörg Grosse, Munich (DE); Jan Lanik, Munich (DE); Raik Brinkmann, Munich (DE)

(73) Assignee: ONESPIN SOLUTIONS GMBH, Munich (DE)

( * ) Notice: Subject to any disclaimer, the term of this patent is extended or adjusted under 35 U.S.C. 154(b) by 434 days.

(21) Appl. No.: 16/620,622

(22) PCT Filed: Jun. 19, 2018

(86) PCT No.: PCT/EP2018/066315
§ 371 (c)(1),
(2) Date: Dec. 9, 2019

(87) PCT Pub. No.: WO2018/234341
PCT Pub. Date: Dec. 27, 2018

(65) Prior Publication Data
US 2020/0200820 A1    Jun. 25, 2020

Related U.S. Application Data

(63) Continuation-in-part of application No. 15/626,674, filed on Jun. 19, 2017, now abandoned.

(30) Foreign Application Priority Data

Jun. 19, 2017   (LU) ........................... 100321

(51) Int. Cl.
G06F 30/3323      (2020.01)
G01R 31/3183      (2006.01)
(Continued)

(52) U.S. Cl.
CPC ..... *G06F 30/3323* (2020.01); *G01R 31/2839* (2013.01); *G01R 31/2844* (2013.01);
(Continued)

(58) Field of Classification Search
CPC ............ G06F 30/3323; G06F 9/30098; G01R 31/2839; G01R 31/2844; G01R 31/318307; G01R 31/318314; G01R 31/31835
See application file for complete search history.

(56) References Cited

U.S. PATENT DOCUMENTS 6,134,516 A    10/2000   Wang et al.
6,188,934 B1*   2/2001   Emura ................. G06F 11/261
                                                                    700/121
(Continued)

FOREIGN PATENT DOCUMENTS

JP    H07306881 A    11/1995
JP    H1166114 A     3/1999
(Continued)

OTHER PUBLICATIONS

A. Riefert, J. Müller, M. Sauer, W. Burgard and B. Becker, "Identification of critical variables using an FPGA-based fault injection framework," 2013 IEEE 31st VLSI Test Symposium (VTS), Berkeley, CA, USA, 2013, pp. 1-6. (Year: 2013).*

(Continued)

*Primary Examiner* — Cynthia Britt
(74) *Attorney, Agent, or Firm* — Lempia Summerfield Katz LLC

(57) ABSTRACT

A system and method for formulating a sequential equivalency problem for fault (non)propagation with minimal circuit logic duplication by leveraging information about the location and nature of a fault. The system and method further (Continued)

apply formal checking to safety diagnoses and efficiently models simple and complex transient faults.

7 Claims, 13 Drawing Sheets

(51) Int. Cl.
 *G01R 31/28* (2006.01)
 *G06F 9/30* (2018.01)

(52) U.S. Cl.
 CPC ............... *G01R 31/31835* (2013.01); *G01R 31/318307* (2013.01); *G01R 31/318314* (2013.01); *G06F 9/30098* (2013.01)

(56) References Cited

U.S. PATENT DOCUMENTS

| | | | |
|---|---|---|---|
| 6,301,685 | B1 | 10/2001 | Shigeta |
| 6,385,750 | B1 | 5/2002 | Kapur et al. |
| 7,926,021 | B2 * | 4/2011 | Biome ............... G06F 30/30 716/136 |
| 8,630,824 | B1 | 1/2014 | Ip et al. |
| 8,683,400 | B1 | 3/2014 | O'Riordan et al. |
| 9,739,827 | B1 | 8/2017 | Spinner et al. |
| 2003/0149916 | A1 | 8/2003 | Ohtake et al. |
| 2007/0050740 | A1 * | 3/2007 | Jacobi ............ G06F 30/3323 716/106 |
| 2007/0245197 | A1 | 10/2007 | Hiraide |
| 2008/0256404 | A1 | 10/2008 | Funatsu |
| 2009/0049331 | A1 | 2/2009 | Blome et al. |
| 2010/0023824 | A1 | 1/2010 | Buckley et al. |
| 2016/0283628 | A1 | 9/2016 | Peixoto et al. |
| 2018/0149696 | A1 | 5/2018 | Erickson et al. |

FOREIGN PATENT DOCUMENTS

| | | |
|---|---|---|
| JP | H11153646 A | 6/1999 |
| JP | 2007293589 A | 11/2007 |

OTHER PUBLICATIONS

Huy Nguyen et al: "Sequential equivalence checking of hard instances with inductive invariants and efficient filtering strategies", High Level Design Validation and Test Workshop (HDLVT), 2002, Nov. 9, 2012, pp. 1-8.

Caty et al: "Microprocessor silicon debug based on failure propagation tracing", Test, 2005, IEEE International Conference on Nov. 8, 2005, IEEE Operations Center, US, pp. 284-293.

Benso A et al: "A Functional Verification based Fault Injection Environment", Defect and Default-Tolerance in VLSI Systems, 2007. DFT '07. 22nd IEEE, International Symposium on, IEEE, Piscataway, NJ, USA, Sep. 26, 2007, pp. 114-122.

Bonfiglio Valentina, et al., "Software Faults Emulation at Model-Level: Towards Automated Software FMEA," 2015 IEEE International Conference on Dependable Systems and Networks Workshops, pp. 133-140 (2015).

Haissam Ziade, Rafic Ayoubi, and Raoul Velazco, "A Survey on Fault Injection Techniques. The International Arab Journal of Information Technology," vol. 1, No. 2, Jul. 2004.

Ashish Darbari, Bashir Al Hashimi, Peter Harrod and Daryl Bradley, "A New Approach for Transient Fault Injection using Symbolic Simulation," 14th IEEE International On-Line Testing Symposium 2008.

* cited by examiner

SYSTEM AND METHOD FOR FORMAL FAULT PROPAGATION ANALYSIS

CROSS-REFERENCE TO RELATED APPLICATIONS

The present application claims priority to U.S. Non-Provisional patent application Ser. No. 15/626,674 filed on Jun. 19, 2017 and entitled "System and Method for Formal Circuit Verification." The present application further claims priority to patent application No. LU 100321 filed in Luxembourg on Jun. 19, 2017 and entitled "Method for Formal Circuit Verification."

The aforementioned patent applications are hereby incorporated by reference in their entirety.

STATEMENT REGARDING FEDERALLY SPONSORED RESEARCH OR DEVELOPMENT

None.

BACKGROUND OF THE INVENTION

Field of the Invention

The present invention relates to equivalence checking as a tool to verify fault propagation or non-propagation in sequential circuits.

Brief Description of the Related Art

Many industries, such as the automotive industry, have incorporated sophisticated electronics into their products and services. Welcome though these advances are, it is critical to understand that the electronic systems enabling these features also present countless new opportunities for things to go wrong if they are not adequately verified. A defective headrest video screen may be an irritation to a young passenger in the back seat, but a malfunctioning corrective steering system could cost the occupants of the vehicle their lives. These risks have caused industries to adopt stringent safety-related standards for electrical or electronic systems.

For example, the ISO 26262 standard governs the development of safety-related electrical and/or electronic (E/E) systems within road vehicles. ISO 26262 imposes stringent requirements that encompass the entire life cycle of a system, from concept phase to development, production, and decommissioning. It addresses the overall safety management process and covers relations with suppliers and interfaces for distributed development. The risk of liability is a clear driver of the adoption of the ISO 26262 standard, but there is more at stake: vehicle recalls in the millions and malfunctions leading to fatal car accidents not only cause economic damage, but also diminish the brand image of the companies involved. The standard specifies two types of component faults, which must be fully verified, systematic faults and random faults.

Systematic faults are introduced during component development, either through human error or tool/methodology malfunction. Systematic faults typically are handled through rigorous verification and the careful tracking of specific device requirements. Random faults occur during the actual operation of the device due to external effects. These faults must be safely handled by the circuitry within the device. This requires the use of fault handling capabilities built into the systems, which must in turn be verified to ensure that they will catch the vast majority of possible random faults.

Over the past several years, automotive suppliers have made substantial investments to meet ISO 26262 requirements, often leading to significant increases in development costs. Maturing the application of the standard and moving towards systematic and automated development methods is critical to achieve and sustain success.

Thanks to ease-of-use and capacity advances, formal-based verification methodologies have achieved recent wide adoption in the industry. Formal verification is widely recognized as a powerful technique to uncover hardware design bugs that might otherwise escape simulation-based verification and lead to systematic failures. A key characteristic of formal tools is the ability to examine design behavior exhaustively, without the need for input stimuli, and prove that the design never deviates from its intended function, as specified by a property or assertion. Even for simple designs, simulation tools cannot achieve this level of precision. Formal tools have multiple applications for both systematic and random fault verification.

Failures happen when an element of a system no longer performs its required function. They are caused by errors, such as a hardware component not behaving as expected. Errors are caused by faults either in the design of the device, or occurring during its operation. Examples of such errors in an automotive environment and possible causes are shown in FIG. 1.

A fault is an incorrect logical value that appears on some logical element in an electronic design ("design under test" or "DUT") either momentarily (due to, e.g., being hit by a high-energetic particle) or permanently (due to, e.g., material decay or permanent damage to the circuitry). Such faults can potentially alter the behavior of the electronic system. These faults can in safety critical systems lead to death, injury or high economical losses.

For this reason, safety critical system designers need to implement measures that detect and/or fix incorrect behaviors introduced by random faults using techniques such as redundant logic circuits, error correcting codes and similar.

ISO 26262 defines two categories of failures: systematic and random. Systematic failures can originate in both hardware and software and have a deterministic relation to certain causes or faults, for example, specification or coding mistakes in software or hardware code. These faults affect all manufactured components and must be avoided. Random failures originate only in hardware and occur in an unpredictable fashion that generally follows a probability distribution. They cannot be traced back to specific problems and are expected to occur during system operation. A good example is radiation corrupting a DRAM memory during device operation. Note that random component failure might be seen as a systematic fault at the vehicle level.

ISO 26262 prescribes the use of safety measures to avoid systematic faults and safeguard against random hardware faults. Formal tools can play a significant role in implementing safety measures efficiently, and indeed are central in many safety-critical development flows.

Safety mechanisms are a class of safety measures built into the device, intended to detect faults or control failures, as shown in FIG. 2A. ISO 26262 may require the use of safety mechanisms to detect, and possibly correct, the effects of some random hardware faults. Safety mechanisms are implemented in both software and hardware, and their ultimate goal is to reduce the occurrence of random failures that could lead to violations of safety goals.

Software-based mechanisms include routines that run periodically to detect hardware errors, mostly caused by permanent faults or latent transient faults. Another example is redundant software performing the same operation multiple times and comparing results. One of the challenges is to detect as many faults as possible, while limiting the size and run time of the code.

Redundancy is the foundation of many hardware-based safety mechanisms. Common techniques include: having a processor core running in lockstep with a duplicate core and comparing results; duplication or even triplication of critical modules or configuration registers with the addition of majority-voting logic (triple modular redundancy); failsafe encoders and decoders to protect memories or bus transactions (EDC/ECC); detecting and correcting single-bit errors; and detecting double bit errors.

Hardware-based safety mechanisms significantly complicate all stages of development, including physical implementation, as they increase circuit area and make it harder to achieve the target clock frequency.

The development of hardware safety mechanisms must follow a rigorous process to avoid systematic faults. The functional verification of the RTL model implementing a safety mechanism is a critical activity, as mistakes could lead to hardware that causes dangerous situations rather than preventing them.

Rigorous development processes are key to reducing the risk of systematic faults in a system, introduced through human error. Advanced hardware development flows employ many tools and methods to detect issues as early as possible, plan verification activities, and track progress. ISO 26262-8 clause 6, however, demands an accurate tracing of requirements throughout the relevant development steps. The ultimate goal is to ensure that a product satisfies its safety requirements. This involves tracking a large number of bidirectional, many-to-many relationships, mapping requirements through design features to verification plan elements, and finally, to feedback test coverage data to all these documents.

For the functional verification of Register Transfer Language (RTL) models, engineers apply a variety of techniques, including directed and random coverage-driven simulation tests. Structural and functional coverage metrics are used to track progress and highlight gaps in the verification plan or specification documents.

Simulation-based verification environments often rely on centralized checks and thus suffer from low design observability. Even when a test activates a design feature that is not correctly implemented, the erroneous behavior could go undetected unless it propagates to an observation point (or checker). ISO 26262 specifies that requirements must be individually tested, and this testing process carefully tracked, as shown in FIG. 4. For simulation, typically this involves creating individual, directed tests, which can be laborious and error-prone.

Assertion-based verification (ABV) is a well-established technique that addresses this issue. Assertions are flexible and can concisely express the expected design behavior at both low and abstract levels. They are distributed and always-on checkers that—crucially, in this context—may map more directly to requirements. Another key benefit of ABV is that formal tools can leverage assertions and examine them under all relevant stimuli scenarios. Moreover, with adequate tools and methodology, it is also possible to construct a set of non-overlapping assertions capturing all design requirements. Assertions, specifically end-to-end properties, can be easier to map to requirements through the implementation and verification plan. By leveraging ABV, the entire verification tracking mechanism is simplified through direct correlations between requirements and tests.

ISO 26262-5 addresses all hardware-specific development activities, and their requirements include a quantitative analysis of the effectiveness of safety mechanisms. Faults are classified according to the categories safe, single point, residual and multipoint. Safe faults are faults that are not in the safety relevant parts of the logic or are in the safety relevant logic but are unable to impact the design function, i.e., they cannot violate a safety goal. Single point faults are dangerous because they can violate a safety goal and there is no safety mechanism to protect against them. Residual faults also are dangerous because they can violate a safety goal and escape the safety mechanism. Multipoint faults can violate a safety goal but are observed by a safety mechanism. The multipoint faults can be subclassified as "detected," "perceived" and "latent."

Within the present context, multipoint faults and safe faults are not dangerous. However, identifying them is challenging. Safety-critical hardware may include a variety of safety mechanisms, and engineers must analyze the effects of several fault types on millions of potential fault locations interconnected by complex logic.

It is not trivial to confidently mark a fault as safe. Without adequate tools, only experts with intimate knowledge of the hardware can reach this conclusion. Similarly, expert engineering effort might be required to develop simulation workloads that can demonstrate the ability of a safety mechanism to observe a fault. Hardware teams for ASIL C or ASIL D applications have to demonstrate that only an extremely low proportion of dangerous faults can have an operational effect on their designs. Consequently, the ability to identify safe and multipoint faults automatically is critical to achieve this goal efficiently.

Fault injection is an established technique used to understand the effects of faults on fault-tolerant systems. ISO 26262 highly recommends the use of fault injection during the development of safety-critical hardware. To take into account operating conditions and full system interactions, fault injection should be performed on a system prototype. For example, instruments can be used to create heavy ion radiation, electromagnetic interference, power supply disturbances, or software issues that corrupt the content of memories or architecturally visible registers. Haissam Ziade, Rafic Ayoubi, and Raoul Velazco, "A Survey on Fault Injection Techniques. The International Arab Journal of Information Technology," Vol. 1, No. 2, July 2004. However, this method is challenging in terms of cost, controllability and observability of the system, and development schedule. Model-based fault injection can be performed early in the development flow and provides finer control over the system without being invasive: that is, the fault injection mechanism has no effect on the system other than the faults it injects. Ashish Darbari, Bashir Al Hashimi, Peter Harrod and Daryl Bradley, "A New Approach for Transient Fault Injection using Symbolic Simulation," 14th IEEE International On-Line Testing Symposium 2008.

The safety analysis of complex automotive SoCs including a variety of safety mechanisms poses many challenges. Precisely identifying the safety-critical implementation logic is no small matter. The number of fault locations to consider can be on the order of millions. Several types of permanent and transient faults can be injected in a fault location, and the effect of a number of simultaneous faults might have to be analyzed under different workloads. The number of relevant fault scenarios is huge.

In recent years, there has been progress in the availability of tools to perform fault injection on hardware models. While existing simulators can perform clumsy fault injection by using generic interface commands, the re-emergence of fault simulators, previously designed for the qualification of manufacturing tests, has brought substantial benefit to engineers in terms of enabling precise metrics and debug.

Fault propagation analysis is used to classify faults and derive diagnostic or detection coverage metrics. This task may be performed on RTL models but, according to ISO 26262 stipulations, will ultimately have to be performed on a model that is as close as possible to the actual hardware and that can provide good correlation not only at the logical level, but also on physical parameters, such as circuit area. This requires running the analysis on gate-level netlists.

Fault simulation is a standard approach to determine fault metrics. Fault simulators inject faults and analyze their propagation under user-defined input stimuli. Faults causing errors that are detected by a safety mechanism contribute to achieving the desired detection ratio. Faults not activated or propagated by the input stimuli consume a large proportion of the simulation cycles, while remaining in the "potentially propagatable" group. These faults are difficult to debug when considering stimulus improvements. In fact, a significant portion of them could be safe or "non-propagatable." Safe faults can never lead to a malfunction of the system, regardless of its state. Engineers may use "expert judgment" arguments to mark some faults as safe, thus increasing diagnostic or detection coverage.

Even modern fault simulators, however, have inherent shortcomings. The analysis of faults is inefficient with respect to both the fault scenarios (some simulators requiring one run per scenario) and the specific workload, or input vectors, applied to the model (simulators only execute one workload at a time). Moreover, to achieve the target ASIL diagnostic or detection coverage—the metric specifying the number of safe faults—engineers may have to manually identify safe faults, create complex tests that can activate and propagate tricky faults to safety logic, and define the boundaries of safety-critical logic. These tasks are effort-intensive, error-prone, and intrinsically incomplete.

Formal verification is widely recognized as a powerful technique to uncover hardware design bugs that might otherwise escape simulation-based verification and lead to systematic failures. A key characteristic of formal tools is the ability to examine design behavior exhaustively, without the need for input stimuli, and prove that the design never deviates from its intended function, as specified by a property or assertion. Even for simple designs, simulation tools cannot achieve this level of precision. Formal tools have multiple applications for both systematic and random fault verification.

"Formal methods" refers to mathematically rigorous techniques and tools for the specification, design, and verification of software and hardware systems. While formal property-checking tools have been available for decades, in the last ten years, thanks to advances in ease-of-use and capacity, formal-based methodologies have achieved wide adoption in the semiconductor industry. Formal verification is widely recognized as a powerful technique to uncover hardware design bugs that might otherwise escape simulation-based verification and lead to systematic failures.

A key characteristic of formal tools is the ability to examine design behavior exhaustively, without the need for input stimuli, and prove that the design never deviates from its intended function, as specified by a property or assertion. Even for simple designs, simulation tools cannot achieve this level of precision. A range of hardware development tasks has been improved through the use of appropriate formal-based solutions (or apps). These range from RTL design exploration and formal linting to the end-to-end verification of critical modules.

Another key characteristic of formal tools, particularly relevant to safety-critical applications, is the ability to finely control the injection of faults into hardware models and analyze their sequential effects. Crucially, formal tools have the potential to perform this task very efficiently, in terms of both user effort and computational demands, and non-invasively (no need for code instrumentation steps).

As part of the safety verification process, it often is necessary to understand how faults propagate through an integrated circuit. Examples of prior systems and methods for waveform or propagation analysis are disclose din U.S. Pat. No. 8,630,824 and U.S. Patent Application Publication No. 2016/0283628.

Conventional fault propagation systems and methods often display a golden design and the faulty design next to one another, showing the value of signals in the golden design versus the design with the fault injected. Such conventional environments might be able to list all internal signals where the values are different between the golden design and the faulty design but they typically would display signals which are different, including signals that are irrelevant to the fault debug.

To ensure that all reasonably expectable random faults and their combinations are handled by the system and that no such faults can induce erroneous behavior of the system, verification engineers typically perform an extensive testing of various scenarios in which faults are injected at different locations of the DUT with the goal of determining whether the behavior of the DUT at some critical observation points (e.g. primary outputs) can be altered and/or whether such alteration can be detected. The information about what portion of potential faults can be detected or automatically corrected is necessary for safety certifications that are required by regulatory authorities in certain fields (e.g., ISO26262 in automotive domain).

Traditionally, analysis of fault propagation and observability is done by simulation of many potential faults under a variety of input patterns. However, simulation of all possible situations is usually not practically possible. Therefore, it is advantageous to use formal verification techniques, which give mathematically irrefutable proofs that a fault does not propagate or is observed. In many cases formal checking may be even faster than traditional techniques based on simulation.

Formal fault propagation analysis is usually done by using equivalency checking, which is a formal method to asses a behavioral equivalency between two circuits. In this case one circuit (golden) will be the original DUT and the other circuit (revised) will be the DUT with a fault scenario modeling a random fault, like stuck at and single event faults (fault) injected at some specific location. This means the size of the circuit provided to the equivalency checker is double of the original circuit (or of the part that needs to be considered).

Use of formal equivalence checking as a tool to verify fault (non)propagation in sequential circuits is disclosed in D. Smith, "How Formal Reduces Fault Analysis for ISO 26262".

Observable behavior of a DUT is defined by a set of observation points. Assuming that one knows the exact place where a fault is going to occur, the objective is to prove either:

1. That the fault has no effect on the DUT values at the observation points (in this case we say the fault is not propagated (NPA)); or
2. Find a trace that leads to a different behavior at some observation point, in particular at least one observation point, due to the fault (in this instance we say the fault is propagated (PA)).

Furthermore, the design may have capability to detect and signal that an error has happened within, leaving the recovery actions to the rest of the system or to the user. This, in effect, introduces additional classification of propagatable faults (PAs). The PAs that have been detected are considered safe faults, while the propagatable faults that are not detected are considered dangerous faults.

TABLE 1

Fault diagnostic

| Type of Fault | Detected | Not Detected |
|---|---|---|
| Non-propagatable | Safe (Detection over-pessimistic) | Safe |
| Propagatable | Safe (Detected) | Dangerous (Not Detected) |

The decision problem of whether a fault is PA/NPA is referred to herein as a fault propagation, the problem whether a fault is detected by the design is referred as fault detection, and the problem of whether it is safe or not is referred to as a fault diagnosis.

Observation Points and Outputs

Normally, the observable behavior of a digital design is defined by value-traces that can be generated on the outputs of the design, provided that its inputs are stimulated by value-traces that conform to input constraints. However, sometimes we may be interested in values of signals that are internal to the design. Also, we may choose to ignore potential propagation to some unimportant signals. Hence instead of the outputs, we will be interested in potential fault propagation into a set of arbitrary defined signals—the observation points. From the mathematical point of view there is no real difference between outputs and observation points, as the internal observation points can be simply labeled as outputs and the output signals that are not observed can be removed from the output set. For this reason, we will use the terms outputs and observation points interchangeably.

Typical Implementation

Classical implementation of formal fault propagation/detection is performed through sequential equivalence check. The present invention provides improvements that make the problem easier for the formal tool, leading to a significantly more efficient procedure.

The usual approach is to inject the fault into the original design and then compare this newly created design with the original, trying to find out a set of input patterns, that applied to both designs lead to different behavior on the outputs. This is done through forming a combined circuit 100 as shown in FIG. 2B, which is known as a sequential check. In this new circuit 100 the same set of inputs 110 is routed to both the original design 120 and faulty design 130. The outputs of both designs 120, 130 are than compared one-by-one with a comparator circuit 140 having comparators 142, 144, . . . 146, and if any of the pairs differ, the output of the comparator circuit 1400 is set to 1 (FIG. 2C.) Now if both the circuits behave the same, the output will always be 0. The sequential equivalence checker uses formal methods in order to prove beyond all doubt that the output always is 0 and hence the output behavior of the faulty circuit 130 is the same as of the original circuit 120 under all possible inputs (NPA). On the other hand, if there is such an input pattern that leads to different behavior of faulty circuit 130, then the output of the comparator circuit 1400 will eventually become 1, and the formal tool will display the exact input pattern under which this happens, omitting the need for any simulation.

SUMMARY OF THE INVENTION

In a preferred embodiment, the present invention is an improvement to prior approaches by applying a more compact encoding of the equivalency problem. The present invention also provides richer fault modelling capable of describing more complex faults. The present invention also extends the application of formal methods from simple fault propagation to fault detection (diagnostic).

In another preferred embodiment, the present invention is a method to minimize the circuit logic duplication needed to formulate the sequential equivalency problem for fault (non) propagation by leveraging the information we have about the location and nature of the fault. The present invention also applies formal check to safety diagnoses and efficiently models simple and complex transient faults.

In a preferred embodiment, the present invention proposes a system and a computer-implemented method for performing a sequential equivalency check for analysis of fault propagation comprising: injecting a fault; identifying, among a plurality of registers, a first set of registers in which the injected fault cannot propagate and a second set of registers in which the injected fault can propagate. For each register of the plurality of registers, the identification comprises running an update function and assigning the register to the second set of registers if the register changes as a result of the update function and assigning the register to the first set if the register does not change as a result of the update function. The method comprises duplicating the second set of registers to derive a reduced stated duplication for performing equivalence checking.

In a preferred embodiment, the step of identifying the first set and the second step comprises a combinatorial check, wherein for each register checking the update function.

In another preferred embodiment the step of identifying comprises a sequential check, in one clock cycle.

The steps may be iterative and repeated.

The method may comprise injecting fault using transient fault modelling.

In a preferred embodiment, the assigning of a register to the first set of registers or to the second set of registers is performed a fixed number of clock cycles after running the update function, wherein the fixed number of clock cycles is greater than one.

The computer implemented method of claim 1 may be used for detection of faults not needing further checking, wherein fault propagations that happen after the error was detected/diagnosed are considered safe or faults not needing further checking.

In yet another preferred embodiment, the present invention is a system and method for analysing faults and displaying a fault propagation path inside a waveform debugger. In the system, a computing device having processor and memory has a fault injection module or application for injecting fault into the circuit design. The computer device further has a fault propagation module or application and/or a fault detection module or application for detecting faults and tracking the propagation of the faults (e.g., signals) through the circuit design. A fault location for injecting a fault and an observation point are identified. At least one observation point is identified. The observation point in the circuit design is a point where errors can have a dangerous impact. The system has a display for displaying a signal path in an ordered list from the fault location to the observation point(s) whereby each signal inside the path has been impacted by the fault. "Impacted" refers to the value in the design between different than what the value would be in a golden design. Only one waveform is shown for a given signal. The impacted signals are shown in a different color (e.g., red) than the non-impacted signals. The signals are displayed in the timing domain, which results in a "stepladder" in a different color showing host the fault moves forward from one signal to the next.

In another preferred embodiment, the present invention is a system and computer-implemented method for calculation and display of a fault propagation path. The method includes the steps of identifying with a computing device a fault location in an electrical circuit, identifying with said computing device an observation point in the electrical circuit, computing with said computing device a fault path from said fault location to said observation point; and displaying in a waveform viewer all signals in said fault path from said fault location to said observation point in order of their creation. The step of computing a fault path may comprise computing the shortest path of impacted signals from the fault location to the observation point. The step of computing the shortest fault path may comprise computing the shortest path in terms of the number of signals, computing the shortest path in terms of the number of instances or computing the shortest path in terms of the number of registers.

The step of computing a fault path may comprise (a) entering an observation point in a current signal list, (b) comparing each signal on the current signal list with an impacted signal list, (c) for each compared signal, if the signal is not on the impacted signal list, doing nothing with respect to that signal, (d) for each compared signal, if the signal is on the impacted signal list, checking if the signal is the fault location, (e) for each compared signal on the impacted signal list, if the signal is the fault location skipping to step (h), (f) for each compared signal on the impacted signal list, if the signal is not the fault location adding the fanin signals of the signal to a next current signal list and storing the signal as the parent of the added fanin signals, (g) making the next current signal list the current signal list and returning to step b, (h) setting the fault locations at the path signal, (i) determining if the path signal has a parent signal, (j) if the path signal has a parent signal, using the parent a new path signal, storing the new path signal in a path list, and returning to step i for the new path signal, and(k) if the path signal does not have a parent signal, outputting the path of impacted signals as the shortest fault path to the waveform viewer. The step of computing a fault path may further comprise initializing the next signal list as empty.

The above computer-implemented method for calculation and display of a fault propagation path may comprise a computer-implemented method for performing a sequential equivalence check for analysis of fault propagation as described above.

The above computer-implemented method for performing a sequential equivalence check for analysis of fault propagation may comprise a computer-implemented method for calculation and display of a fault propagation path as described above.

Still other aspects, features, and advantages of the present invention are readily apparent from the following detailed description, simply by illustrating preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description or may be learned by practice of the invention.

BRIEF DESCRIPTION OF THE DRAWINGS

For a more complete understanding of the present invention and the advantages thereof, reference is now made to the following description and the accompanying drawings, in which.

DETAILED DESCRIPTION OF THE PREFERRED EMBODIMENTS

Figure 3:
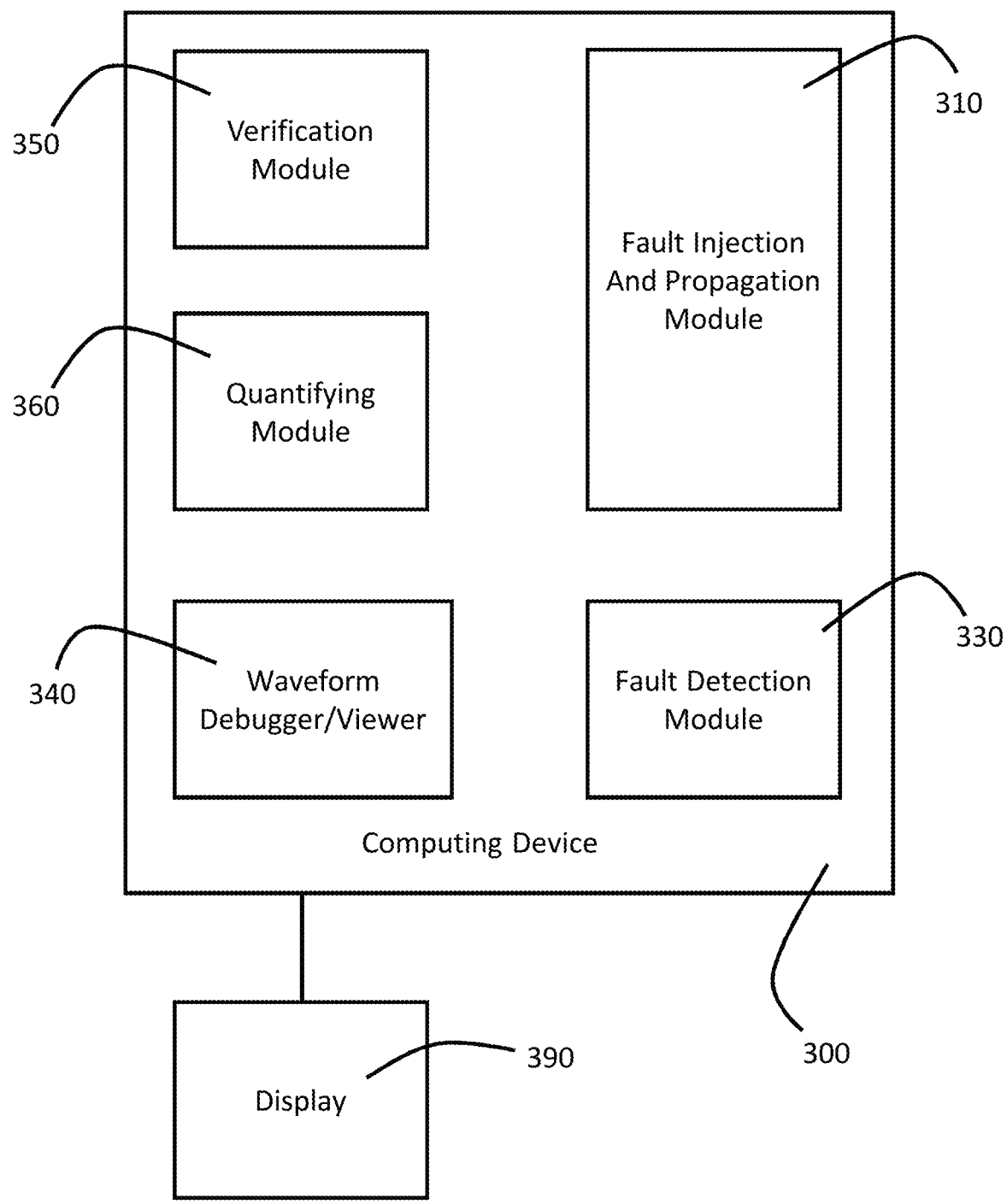
FIG. 3 is a system architecture diagram of a system for analyzing and displaying fault propagation in accordance with a preferred embodiment of the present invention.

A general architecture for a system and method for analyzing and displaying fault propagation path in accordance with a preferred embodiment of the present invention is shown in FIG. 3. The system includes a computing device 300, which may be a computer or server having one or more processors, a memory and a non-transitory storage medium such as a hard drive or solid state drive. The computing device 300 has a fault injection module 310, a fault propagation and detection module 320, and a waveform debugger 340. The computing device may have other modules or applications such as a verification module 350 or a Quantifying module 360. The system further has a display 390. The fault injection module or application 310 provides a simple and flexible interface to define and inject fault scenarios, with no need to change the design, go through complex code-instrumentation steps, or develop a dedicated verification environment.

Fault propagation analysis comprises the injection of faults into the gate level models of integrated circuits during verification to prove that faults will be propagated or detected by a safety mechanism. These gate level models can be complex and contain numerous possible fault scenarios. In order to satisfy hardware safety goals, the number of "dangerous non-detected" faults must be minimized.

Fault simulation is a standard approach to determine fault metrics. Faults are stimulated and propagated to observation points, to ensure detection by a safety function. Any faults not activated or not propagated by the functional stimulus consume a high proportion of the simulation cycles. They are also difficult to debug when considering stimulus improvements. Thus these faults often remain in the "non detected" group, detracting from the desired detection ratio.

A fault scenario can be seen as a set of faulty variants of the original design, the design under test (DUT). The first element of a fault scenario is the set of bit-level design signals where faults shall be injected. The other elements define when and which types of faults shall be injected. The original design corresponds to the particular fault scenario of no faults being present.

Users have the flexibility of defining custom fault scenarios, or pick predefined ones. A simple scenario could describe the injection of stuck-at-0 faults on all bits of a number of design signals, all the time. A custom scenario could describe the injection of a SEU fault, e.g. a bit-flip, in an arbitrary bit of a memory location, occurring only once and coinciding with some other condition, for example a memory read on a specific address. User assertions can be associated with specific fault scenarios, and powerful proof strategies are automatically setup to handle the simultaneous exhaustive verification of huge fault populations in large and complex designs. Moreover, dedicated debug features speed up the daunting task of examining assertion failures on fault-injected designs, where things can get quite confusing. Finally, the quantify module can measure the coverage of the overall set of assertions at the push of a button and expose both mission and safety-related functional areas that have verification gaps.

Faults can be classified as propagatable and non-propagatable. Non-propagatable faults can never lead to a malfunction of the system regardless of its state. Hence they are safe and can be removed from the dangerous fault list, improving the fault metric. This is where formal technology such as equivalency checking can be effectively applied in an automated way using the Fault Propagation and Detection Module 320. The Fault Propagation and Detection Module 320 automatically identifies non-propagatable faults, allowing their safe elimination prior to simulation, thereby cutting on simulation and debug time while increasing the nominal fault coverage. Any know method for identifying non-propagatable faults may be used.

The Fault Propagation Module 320 is applied to the overall fault population both prior to and after fault simulation. The Fault Propagation Module 320 has a "fast mode" and a "deep mode." Operating in a "fast mode" the Fault Propagation Module 320 is run pre-simulation, utilizing formal analysis to efficiently identify non-propagatable faults, thereby enabling the desired fault detection ratio to be rapidly achieved while avoiding unnecessary effort. These faults may be pruned from the fault list without the requirement for fault simulation test vectors. The entire fault-simulation process is significantly accelerated through the removal of this class of faults from those that need to be run in fault simulation.

Operating in a "deep mode" the Fault Propagation Module 320 can be used to analyze non-propagatable faults identified during a simulation-based fault injection process to either improve the safety mechanism or to classify them as safe. This automated step greatly reduces the manual effort required post-fault simulation to identify any remaining dangerous faults. The analysis is accomplished without modification of the netlist—a requirement of the certification standards.

The only required input is a gate or RTL model for the circuit under test. The system identifies fault locations where it already performs optimizations such as net collapsing to avoid duplications. Alternatively, a fault list or design areas of interest indication may be provided, which is used by the tool to refine the fault list.

Furthermore, an initial design state may be loaded to allow a context analysis. Such an analysis can be important to understand how faults behave when injected at a certain execution time.

After fault list creation, the system performs a fully automated formal analysis to identify non-propagatable faults. After the analysis, the non-propagatable, as well as the potentially propagatable faults can be written into a simple CSV formatted text file for further processing. In addition, an analysis summary report is generated. A fast statistical analysis may also be performed where the fault list is sampled rather than analyzing all faults.

Figure 1:
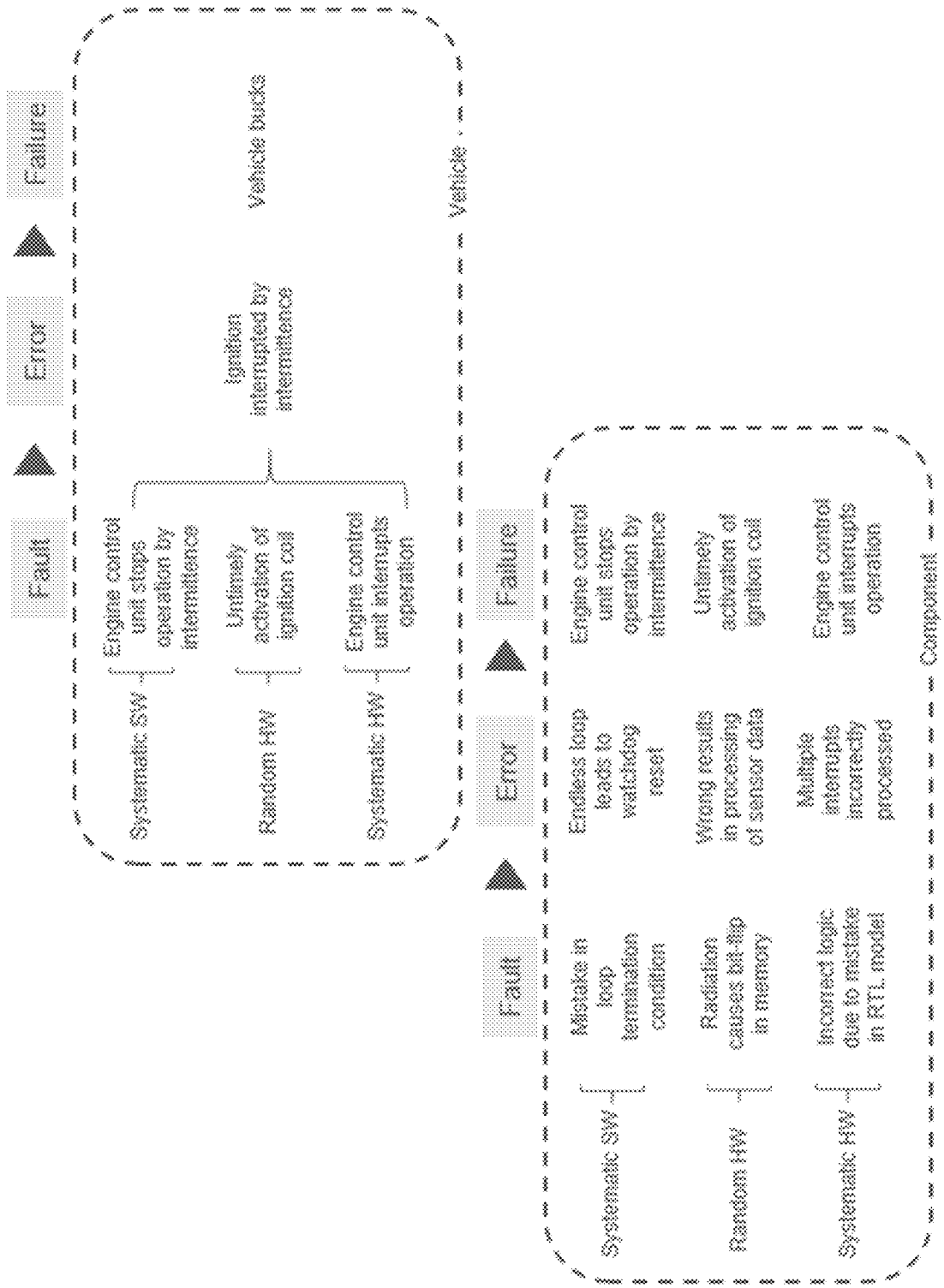
FIG. 1 is a diagram illustrating various types of faults that may occur in a safety critical system and exemplary results of such faults.
Figure 2A:
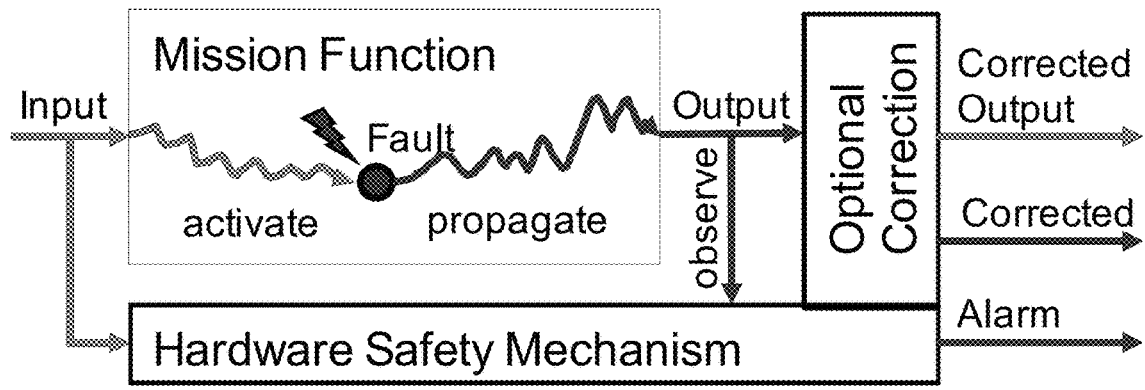
FIG. 2A is a diagram illustrating a general safety critical system having a hardware safety mechanism.
Figure 2B:
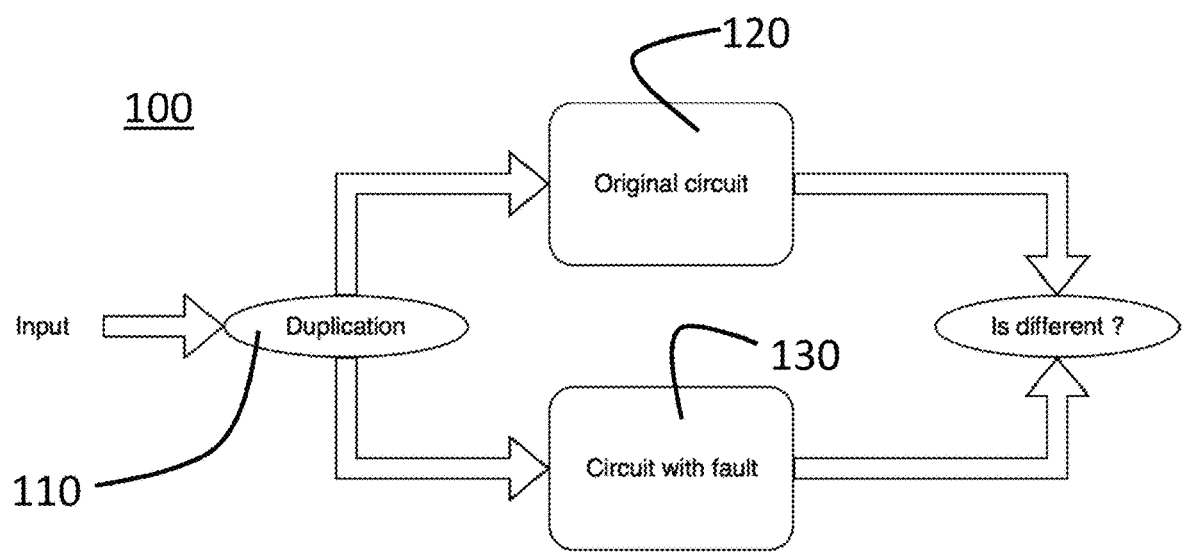
FIG. 2B is flow diagram of a conventional (prior art) circuit for performing a sequential equivalence check.
Figure 2C:
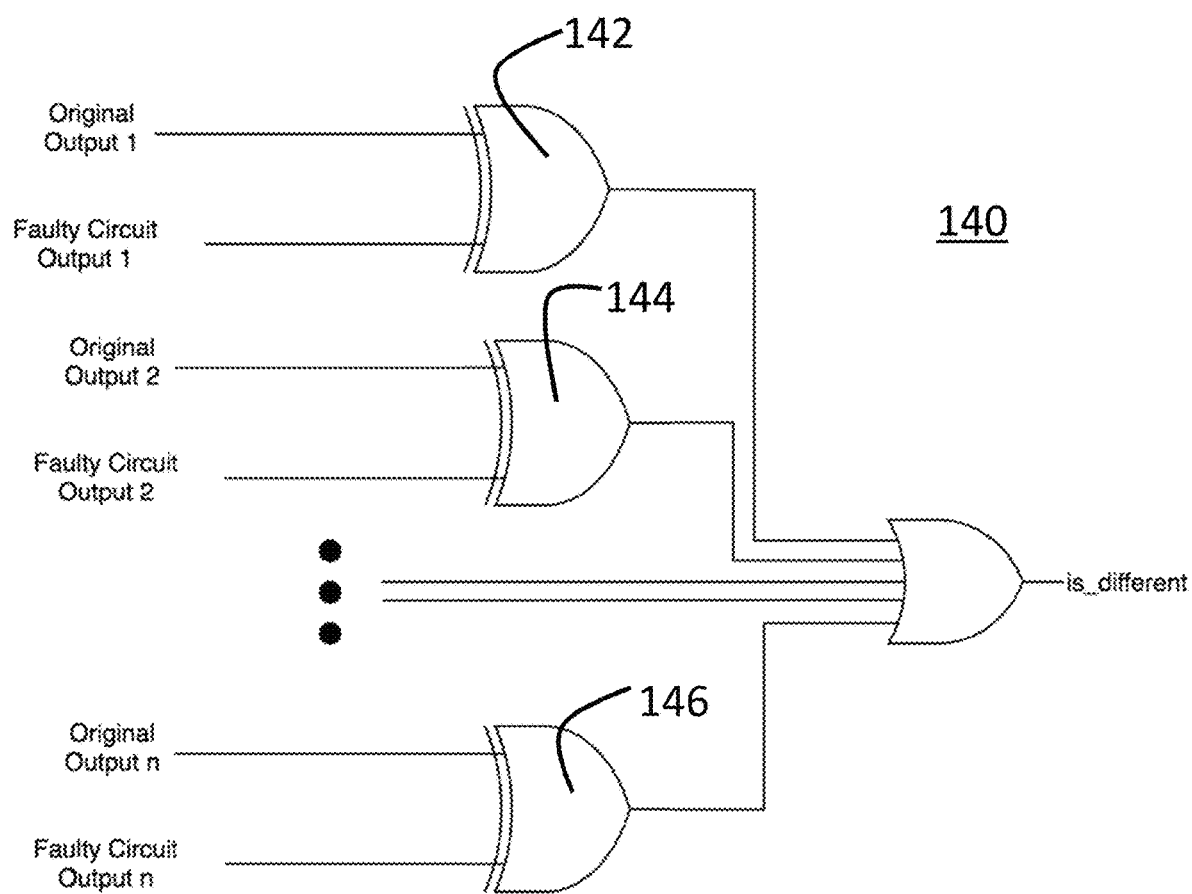
FIG. 2C is a schematic diagram of a conventional (prior art) comparator circuit for comparing outputs in a sequential equivalency check.

The present invention incorporates compact encoding for the equivalence problem. The classical equivalence checking procedure requires duplication of the circuit logic as shown in FIG. 2B. The combinatorial logic duplication can be usually reduced, if this logic depends on primary inputs that are shared between designs. The state-full elements (flip-flops, memories etc., we will call those registers for simplicity) need to be duplicated as well as combinatorial logic which depends on these registers.

In the present invention using compact encoding, registers need to be duplicated only if the faults can propagate into them. If it is known that the value in a register is not affected by a fault injection, then this register can be shared between the original and faulty design, as they have always the same value anyway. In this way, the present invention reduces duplication of combinatorial logic in the fan-out of such a state.

Some simple methods for identifying the unaffected states are known. The main idea in those is that a fault cannot propagate to a register which is not in its cone of influence. This structural argument has the merit of being easy to implement, however, many times the fault does not propagate to registers which are in its cone of influence, for instance because of constrains (external or coming from the design itself). The present invention provides a method and system to find the set of registers that are not affected by the fault using a formal check.

Figure 4:
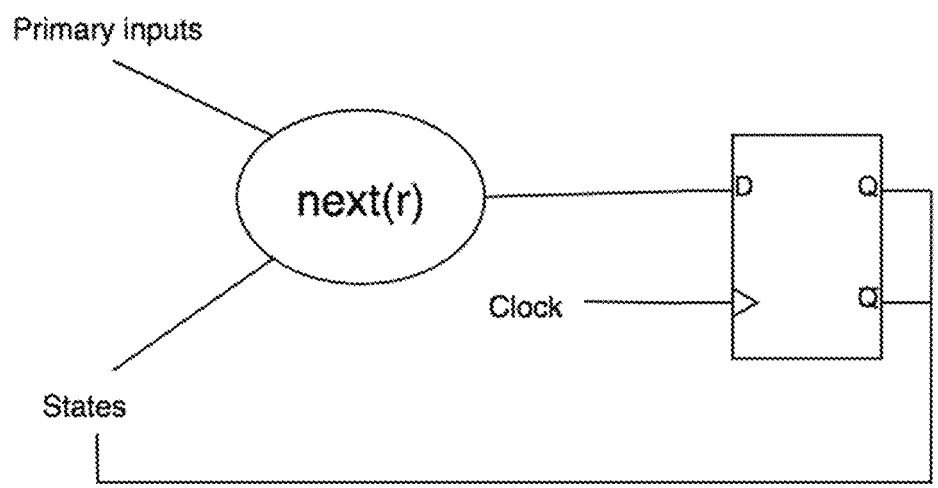
FIG. 4 is a diagram of a next state function in accordance with a preferred embodiment of the present invention.

First, as shown in FIG. 4 consider that every register r has a next state function next(r), which is given by the combinatorial logic feeding its input. The variables in these functions are either primary inputs or other registers. We can check whether the next state can be different in the presence of a fault in the same way as in FIG. 2B (inputs=primary inputs+states). However, as we consider the states to be variables in the next state function, this check can be realized as a combinatorial check with one call to the sat solver. If such a check is successful, we can be sure that the fault is not propagated into this register. On the other hand, if the check is not successful, it can happen that the particular state of the other registers under which the propagation happens is not reachable due to sequential properties of the design.

Therefore, if we are not successful with the combinatorial check, we can proceed with a sequential check that takes into account reachability. However, such check can be demanding, sometimes as demanding as the fault propagation check itself. Still it is a useful heuristic to try to run the sequential check on low effort (short timeout), as it can solve some cases fast.

Figure 5:
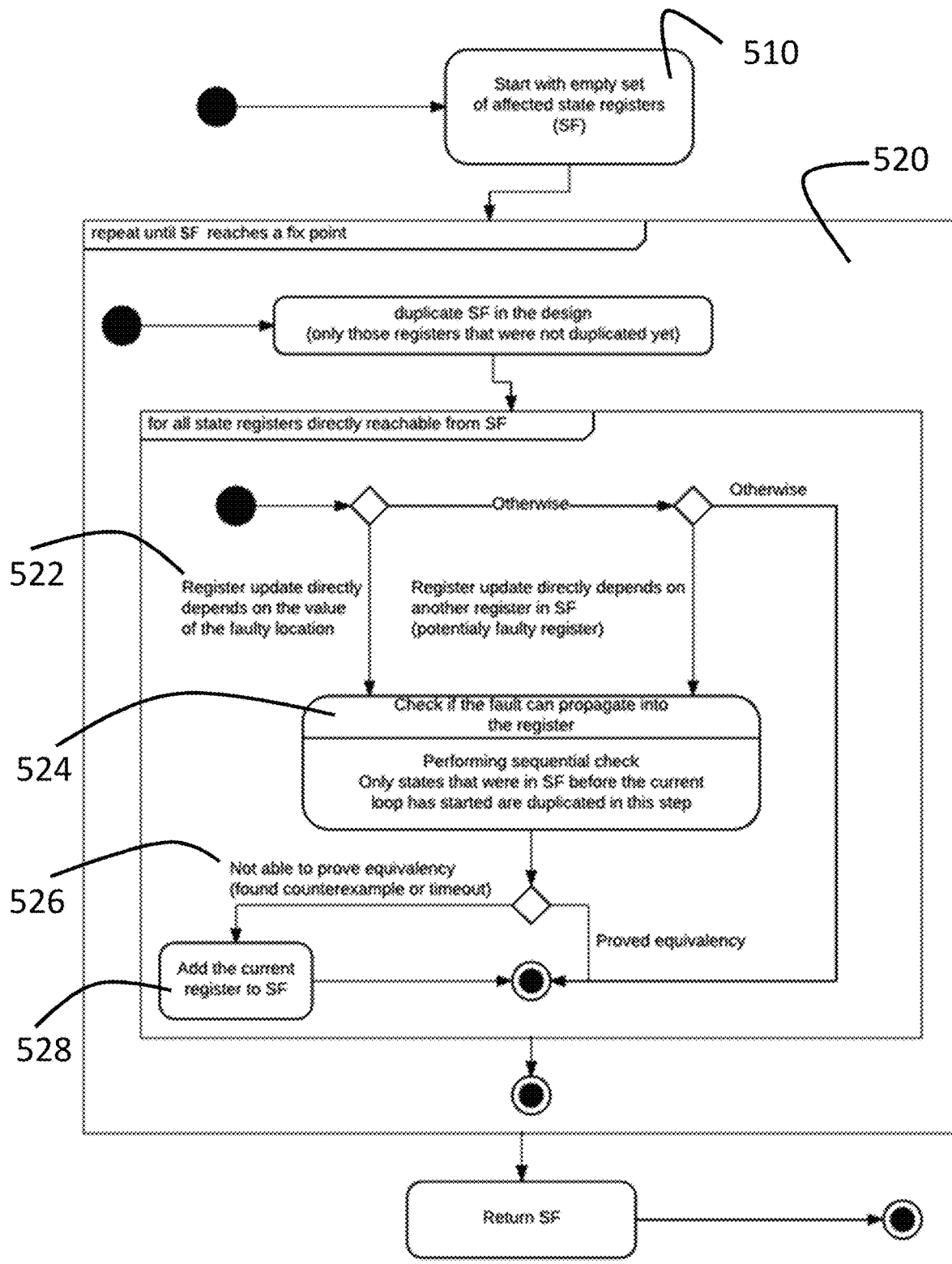
FIG. 5 is a flow chart of a method for iterative state mapping in accordance with a preferred embodiment of the present invention.

To minimize the state duplication and to simplify the problem, the present invention uses the method shown in FIG. 5 that iteratively builds the set of states into which the fault propagates. It is based on inductive reasoning. A set of states $S_{faulty}$, into which the fault can potentially propagate is built inductively based on the assumption that it cannot propagate to the other states (this allows state space reduction). When a fixpoint is reached, the fault is proven to never propagate into registers that are not present in $S_{faulty}$. Therefore only registers that are present in $S_{faulty}$ need to be duplicated.

At initialization there is a set of registers S of which there is an empty set of affected state registers $S_{faulty}$ (510). For each register that is directly reachable from the fault location, run a combinatorial or sequential equivalency check for its update function next (r) (520). If the register update directly depends on the value of the faulty location (522), then check if the fault can propagate into the register (524). If the fault can propagate into the registers (526), i.e., it is not able to prove equivalency (found counterexample or timeout), then add that register to the set of $S_{faulty}$ (528). Once all registers directly reachable from the fault location are tested, the system checks whether any new states were added to $S_{faulty}$. If no new states were added, $S_{faulty}$ has reached a fixed point and the method is complete. If new states were added to $S_{faulty}$, then step 520 is repeated for all registers r from S that are not yet in $S_{faulty}$ and which are directly reachable from a state in $S_{faulty}$ or from the fault location.

Figure 6:
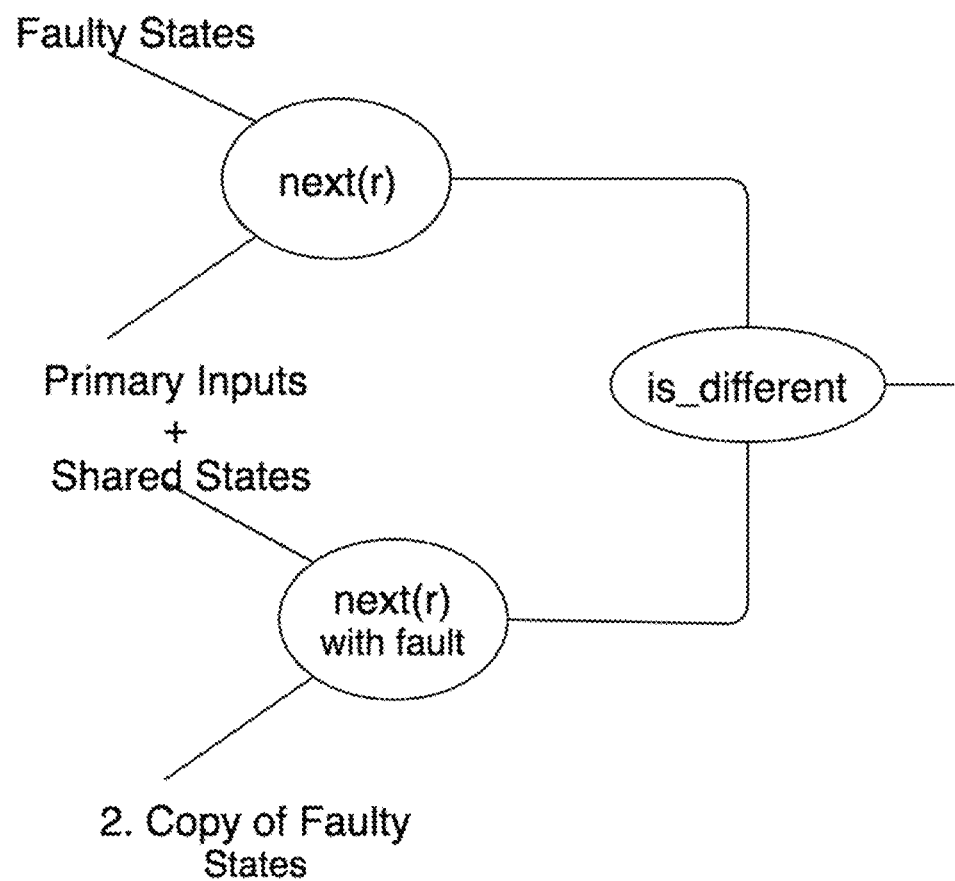
FIG. 6 is a flow diagram of a circuit for performing a sequential equivalency check in accordance with a preferred embodiment of the present invention.

After the method is finished, $S_{faulty}$ contains the registers that can at some point have a different value in the original and faulty design. The rest of the states can be shared in the sequential check in analogically as shown in FIG. 6. We say that such states that need not be duplicated are mapped.

Apart of reducing the state space of the final formal NPA/PA check, identifying shared states can prove non-propagation for some observation points directly, provided that an observation point is connected to the fault location only through shared states. This can be improved further by removing the shared states from the cones of influence of the fault (as we have proven that even though they are structurally connected, there is in fact no influence).

Figure 7:
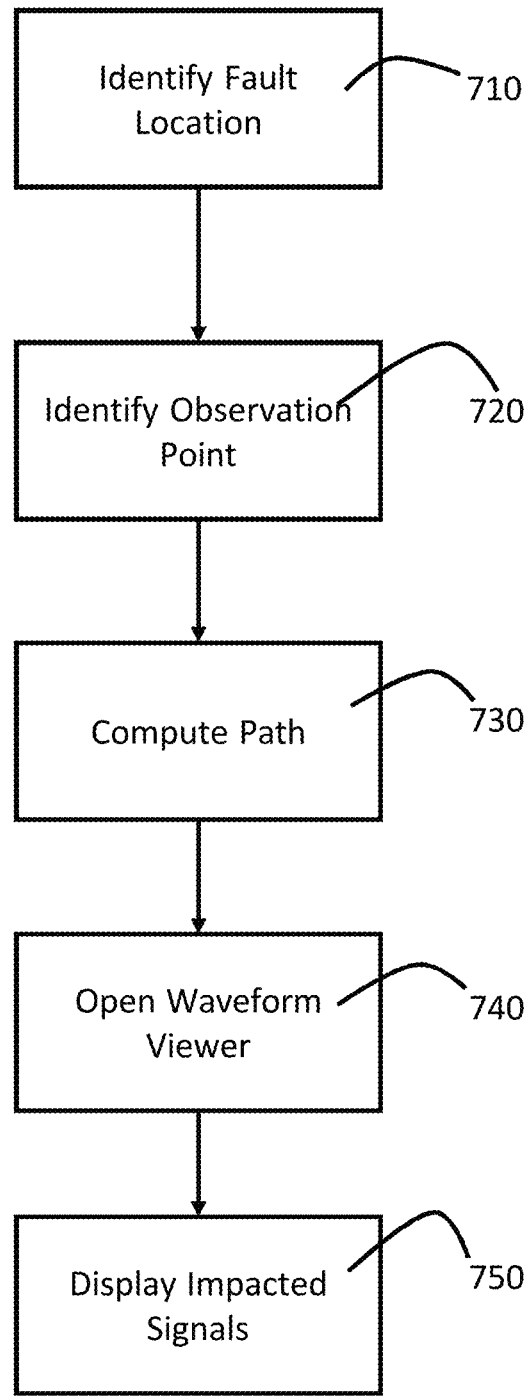
FIG. 7 is a flow chart of a method for analyzing and displaying fault propagation in accordance with a preferred embodiment of the present invention.

In the method of a preferred embodiment of the present invention, as shown in FIG. 7, the system identifies 710 a fault location for injecting a fault and identifies 720 an observation point. The observation point in the circuit design is a point where errors can have a dangerous impact. The system computes 730 the fault path (explained later in further details with reference to FIGS. 7 and 8). The system then opens 740 a viewer in the waveform debugger 340. The system 300 then displays 450 on the display 390 an impacted signal path in an ordered list from the fault location to the observation point whereby each signal inside the past has been impacted by the fault. "Impacted" refers to the value in the design between different than what the value would be in a golden design. In alternative embodiments, a plurality of observation points may be used, for example, if the fault propagates to more than one observation point.

Figure 8:
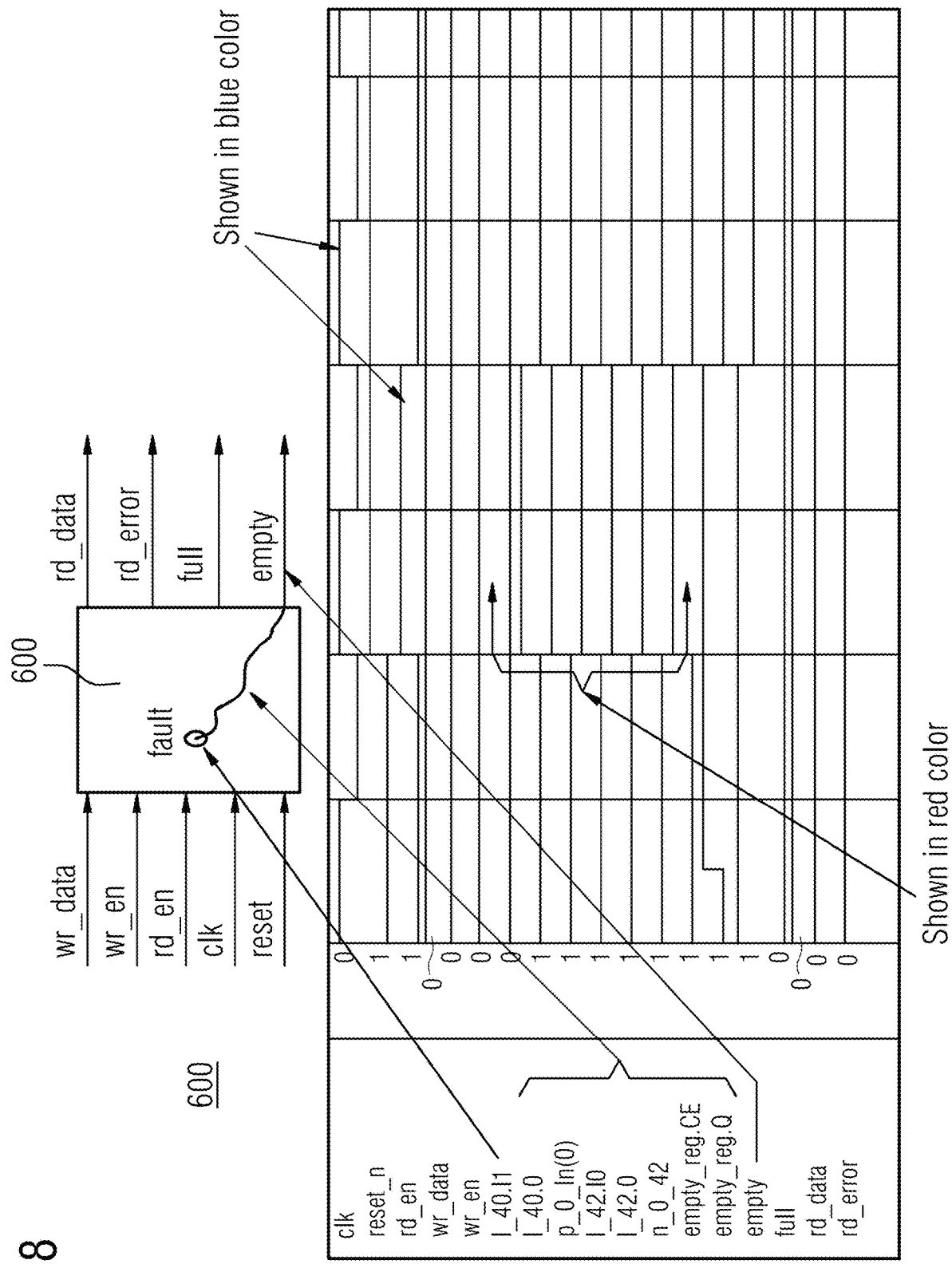
FIG. 8 is an illustration of a display of a system for analyzing and displaying fault propagation in accordance with a preferred embodiment of the present invention.

As shown in FIG. 8, only one waveform is shown for a given signal. The impacted signals are shown in a different color (e.g., red) than the non-impacted signals. Indicators other than color, such as line thickness or the type of line (e.g., dashed, dotted, etc.) or any other visual indicator, may be used. Preferably, the signals are shown in a different color only when the value of the golden and faulty signal is different. Also, as an alternative to the display shown in FIG. 8, the values of the golden and fault signals could be placed next to each other onto a given single wave. Displaying two values can be particular useful when the displayed signal is not a single bit. The signals are displayed in the timing domain, which results in a "stepladder" in a different color showing host the fault moves forward from one signal to the next. Different colors may be used in the display to show how the fault moves forward from one signal to the next. As also shown in FIG. 8, it may be beneficial to display the inputs of the device before the signal and the outputs of the device after the signal. In the alternate embodiment having multiple observation points, data and graphs for a plurality of observation points can be shown on the display or waveform viewer.

Figure 9:
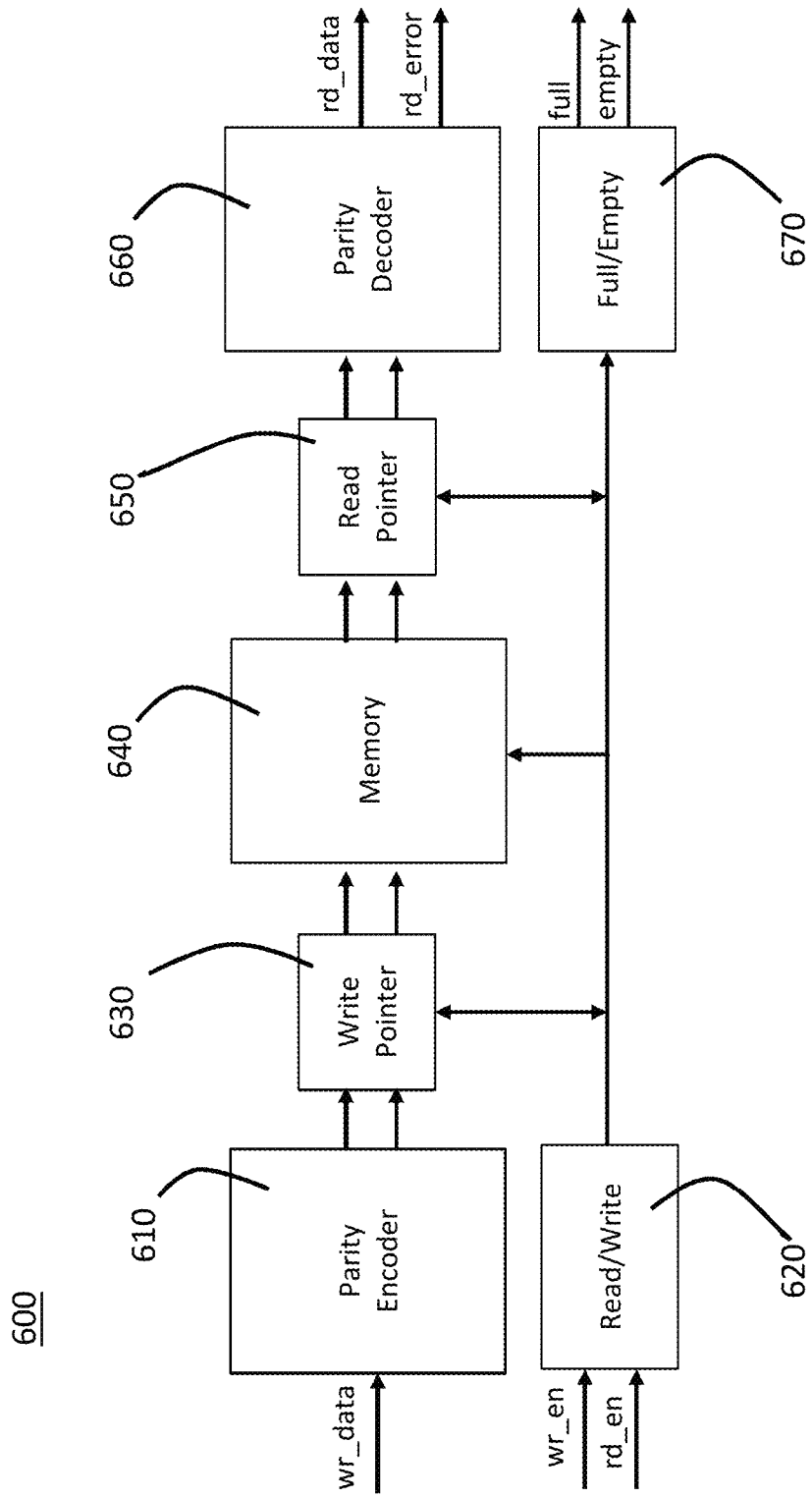
FIG. 9 is a flow diagram illustrating signal flow through a system for analyzing and displaying fault propagation in accordance with a preferred embodiment of the present invention.

An exemplary architecture 600 for verification of hardware safety mechanisms is shown in FIG. 9. The system has a parity encoder 610, read/write 620, write pointer 630, memory 640, read pointer 650, parity coder 660 and full/empty 670.

As shown in FIG. 9, the inputs for the fault path calculation 800 are start point (fault location) and end point (observation point), a list of signals that were impacted by the fault as calculated from a counterexample (the complete list of impacted signals), and the fanin/fanout relation of each single signal in the design. The output of the fault path calculation is the shortest path from the start point to the end point. The shortest path can be in terms of the number of signals, the number of instances or a number of registers/states. Instances can have different numbers of signals attached to them. An instance is typically a cell (like an AND call or FlipFlop cell). The shortest path from the start point to the end point may not be the absolute shortest path but may include any deviations or alterations between the start point and the end point. Deviations or alterations may added by any means such as FlipFlop and the like.

Figure 10:
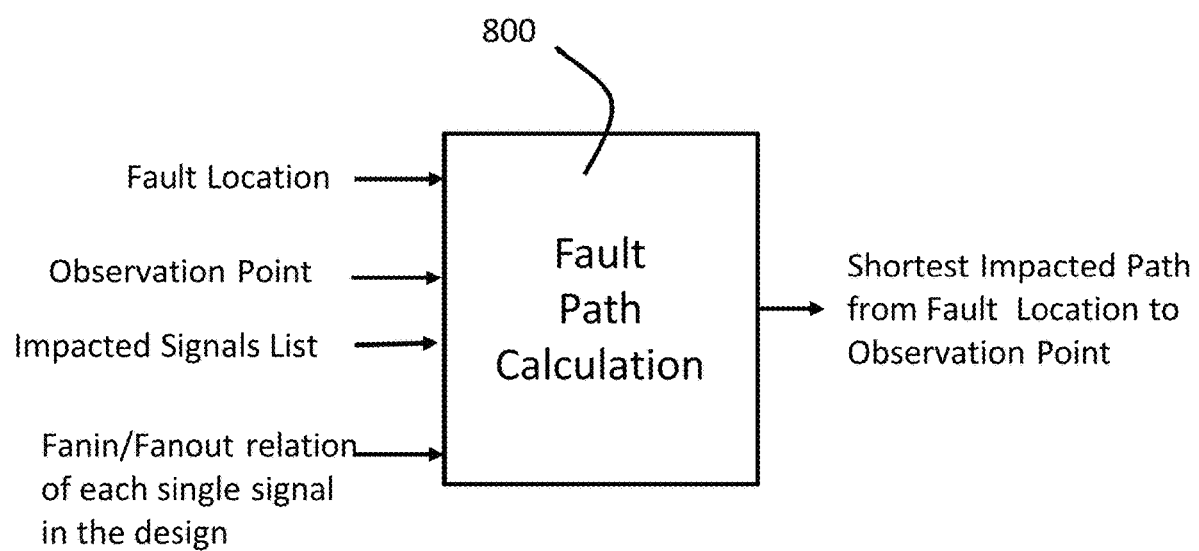
FIG. 10 is a diagram illustrating a fault path calculation in accordance with a preferred embodiment of the present invention.
Figure 11:
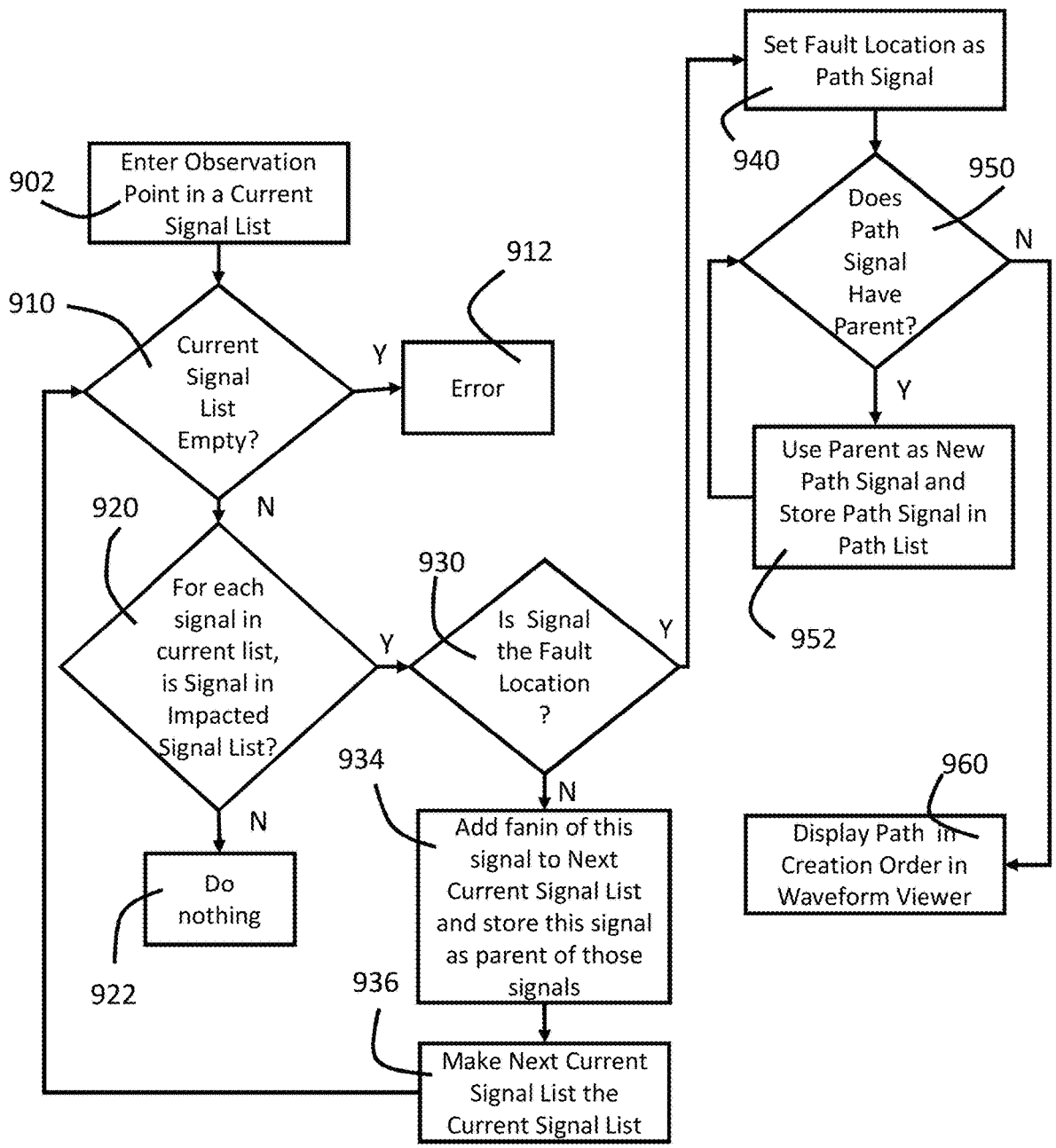
FIG. 11 is a flow diagram of a method for computing a fault path in accordance with a preferred embodiment of the present invention.

An exemplary method for computing a fault path in accordance with a preferred embodiment of the present invention is described with reference to FIG. 10. The inputs for the calculation are shown in FIG. 8. An Observation Point is entered into a Current Signal List at 902. If this is the first iteration, the Current Signal List may have only one signal (the Observation Point). If it is a later iteration, the Current Signal List will have a plurality of signals. At 910, if the Current Signal List is empty, the system knows there is an error and appropriate error notification is undertaken at step 912. If the Current Signal List is not empty at 910, the system determines at 920 for each signal in the Current Signal List whether that signal is on the Impacted Signal List. If a particular signal is not on the Impacted Signal List, the system does nothing at 922 with respect to that signal. If a particular signal is on the Impacted Signal List, the system checks at 930 whether the signal is the Fault Location. If it is not the Fault Location, the system adds the fanin of this signal to a Next Current Signal List and stores the signal as the parent of those fanin signals at 934. Once all signals on the Current Signal List have been checked, the system makes the Next Current Signal List the Current Signal List at 936 and then returns to 910. If a signal is the fault location at step 930, the system sets the fault location as the path signal at 940. The system than determines at 950 whether the path signal has a parent. If yes, the system sees that parent as a new Path Signal and stores that Path Signal in the Path List at 952. The system then returns to step 950. If the Path Signal does not have a parent, the system displays the path in creation order in a waveform viewer at 960. In this way, the shortest path from the fault location to the observation point is determined and displayed.

Encoding Fault Detection/Diagnosis

In many cases, hardware components contain internal diagnostic or detection mechanism that checks for potential erroneous behavior. If such a behavior is observed, an error is communicated outside, using special outputs (error flags). The user (usually software or other connected hardware) is responsible for recovering from the error. Errors that are detected by the internal detection mechanism and announced to the user are considered safe errors. Alternatively, ISO 26262 part 5 also classifies such errors as multipoint detected failures. An error that is not detected by the internal detection mechanism is a dangerous failure and ISO 26262 part 5 classifies such dangerous failures as residual.

Hence, we want to ensure that the formal tool does not consider behavior where the injected fault is detected by the internal detection mechanism. We can achieve this by setting the output of FIG. 7 to 0 if the internal detection mechanism reports an error. However, this requires the error flag to be raised by the internal detection mechanism in exactly the same clock cycle in which the fault is propagated.

A more powerful approach requires the error flag to keep the high logical value once it was set. This ensures that all the fault propagations that happen after the error was detected/diagnosed are considered safe.

The most complex situation arises if the error can be recognized by the internal detection mechanism only a certain number of clock cycles after a fault has propagated to the observation points. In case there is a given fixed number of clock cycles in which the error flag is raised, we can postpone the 'is different' signal from FIG. 6 accordingly using a corresponding number of registers connected in a series, making sure that a difference will be found by formal tool only after the specified number of clock cycles, giving enough time to the internal mechanism to signal the presence of an error.

The presence of a fixed limit is not a limitation, as the user needs to have a way to decide whether an error occurred in finite time and if no limit was imposed it would require the user to wait indefinitely.

Transient Fault Modelling

A basic fault modeling consists of introducing a constant value in place of a given signal in the circuit. This means the faulty signal will always have the same value in simulation or formal check. This model is called stuck-at-0 or stuck-at-1 based on the value of the injected constant or in general it can be called stuck-at-value.

Even though this model can be used successfully for some types of faults, sometimes we may be interested in transient faults, as when for instance a circuit element is hit by a high-energetic particle, leading to a temporary change of its logical value for one or multiple clock cycles.

Transient faults may be easy to model in simulation, where the faulty values are typically inserted randomly, however in formal setting we need to adjust our model to express the upfront unknown time and limited duration of this type of random errors.

A simple example of a transient fault is a single upset. This means a signal value is affected by a fault only for one clock cycle, however we don't know upfront when it is going to occur. This uncertainty is modelled as non-determinism introduced by a new input. A high value on the new input forces the fault to occur provided it has not occurred so far. The single-upset fault injection can be modelled by added sequential logic as in FIG. 12. This enables a formal tool to consider only such execution paths that contain faulty value for exactly one time cycle without enforcing a concrete clock cycle during which the fault is injected.

Figure 12:
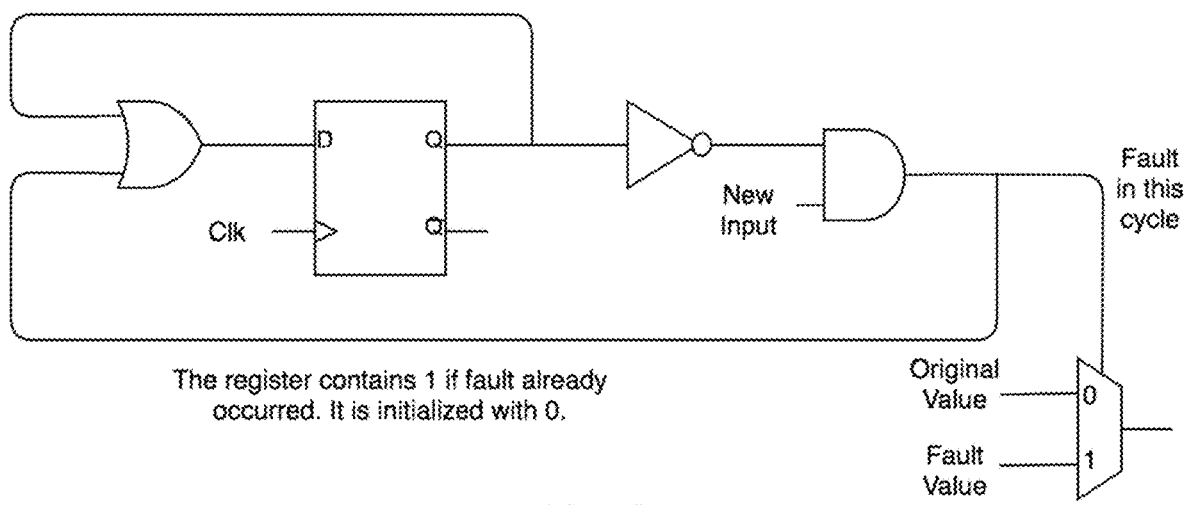
FIG. 12 is a diagram of a controller for a single-upset fault injection in accordance with a preferred embodiment of the present invention.

The circuit from FIG. 12 is an implementation of a finite automaton equivalent to the regular expression "n*fn*", where "n" is non-faulty state and f is faulty state. This regular expression says that unspecified number of non-faulty states is followed by exactly one faulty state and then again unspecified number of non-faulty states. In a similar manner, we can describe even very complex fault patterns.

The process of turning regular expressions into automata and automata into circuits is well established.

We can support in this way any fault patterns that are describable by a regular expression.

The method of the present invention reduces the size of equivalence checking problem that arises when proving fault non-propagation in sequential circuits. This approach leads to higher state space reduction than prior systems and methods.

The method of the present invention further diagnoses safety of fault propagation by encoding it as a formal property.

Still further, the method of the present invention encodes one-time-upset and more general upset schemas within the formal problem that is presented to the sequential equivalence checker. We support any upset patterns that can be expressed by a regular expression or a similar formalism.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A computer-implemented method for performing a sequential equivalency check for analysis of fault propagation, the method comprising:

injecting a fault;

identifying, among a plurality of registers, a first set of registers in which the injected fault cannot propagate and a second set of registers in which the injected fault can propagate;

wherein, for each register of the plurality of registers, the identification comprises running an update function and assigning the register to the second set of registers when the register changes as a result of the update function and assigning the register to the first set when the register does not change as a result of the update function; and duplicating the second set of registers to derive a reduced stated duplication for performing equivalence checking.

2. The computer-implemented method of claim 1, wherein the identifying of the first set of registers and the second set of registers comprises a combinatorial check, wherein the update function is checked for each register.

3. The computer-implemented method of claim 1, wherein the identifying comprises a sequential check in one clock cycle.

4. The computer-implemented method of claim 1, wherein the injecting, the identifying, and the duplicating are iterative and repeated.

5. The computer-implemented method of claim 1, wherein the fault is injected using transient fault modelling.

6. The computer-implemented method of claim 1, wherein the assigning of the register to the first set of registers or to the second set of registers is performed for a fixed number of clock cycles after running the update function, and wherein the fixed number of clock cycles is greater than one.

7. The computer-implemented method of claim 1, used for detection of faults not needing further checking, wherein fault propagations that happen after an error is detected/diagnosed are considered safe or faults not needing further checking.

* * * * *